(12) United States Patent
Bish et al.

(10) Patent No.: US 6,906,413 B2
(45) Date of Patent: Jun. 14, 2005

(54) INTEGRATED HEAT SPREADER LID

(75) Inventors: Jack Bish, Santa Barbara, CA (US); Kevin Hanrahan, Santa Barbara, CA (US); Damon Brink, Goleta, CA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/449,940

(22) Filed: May 30, 2003

(65) Prior Publication Data

US 2004/0238944 A1 Dec. 2, 2004

(51) Int. Cl.$^7$ .......................... H01L 23/10; H01L 23/34
(52) U.S. Cl. ........................................ 257/706; 257/730
(58) Field of Search ............................... 257/704, 705, 257/707, 712–714, 721–722, 730

(56) References Cited

U.S. PATENT DOCUMENTS

| | | | |
|---|---|---|---|
| 4,611,238 A | 9/1986 | Lewis et al. | |
| 4,753,290 A | 6/1988 | Gabuzda | |
| 6,167,948 B1 | 1/2001 | Thomas | |
| 6,288,900 B1 * | 9/2001 | Johnson et al. | 361/705 |
| 6,302,192 B1 | 10/2001 | Dussinger et al. | |
| 6,407,922 B1 | 6/2002 | Eckblad et al. | |
| 6,469,381 B1 | 10/2002 | Houle et al. | |
| 6,504,242 B1 | 1/2003 | Deppisch et al. | |
| 6,504,723 B1 | 1/2003 | Fitzgerald et al. | |
| 6,538,320 B1 | 3/2003 | Tosaya et al. | |
| 6,549,407 B1 * | 4/2003 | Sauciuc et al. | 361/699 |
| 6,637,506 B2 * | 10/2003 | Gektin et al. | 165/185 |

* cited by examiner

Primary Examiner—Phuc T. Dang
(74) Attorney, Agent, or Firm—Sandra P. Thompson; Bingham McCutchen LLP

(57) ABSTRACT

A heat spreader lid includes an outer periphery region having a lip for bonding to an underlying substrate board, a center region, and one or more strain isolation regions. The strain isolation regions are located between the center region and the outer periphery region and may comprise a number of slots cut partially or completely through the lid in a pattern surrounding or partially surrounding the center region. The strain isolation regions provide isolation of strain and relief of stress due to thermal expansion of the lid despite constraint at its periphery by the bonded lip, resulting in less thermally-induced warping of the center region, less thermally-induced stress on the bond between the lip and the substrate board, and/or less thermally-induced deflection of the substrate board. The reduced warping, stress, and/or deflection increases the reliability of the system by reducing the propensity for delamination or separation in the interface between the lid and the die, and/or by reducing the chance of structural failure in the bond between the lid and the substrate board.

35 Claims, 5 Drawing Sheets

INTEGRATED HEAT SPREADER LID

BACKGROUND OF THE INVENTION

1. Field of the Invention

The subject matter disclosed generally relates to the field of heat dissipation devices for electronics components.

2. Background Information

Many modern electrical devices, such as computers, include integrated circuits having many small circuit components that are fabricated on a fragile chip or "die." Practical circuit components generate heat during operation. The complexity, compactness, and fragility of the circuitry on the die presents several challenges to designers of heat dissipation devices for the die. First, the heat dissipation device must facilitate adequate thermal egression to prevent an associated die from reaching an excessive temperature. Second, the heat dissipation device must be electrically isolated from the circuitry on the die so as not to interfere with the operation of the circuit. Third, the heat dissipation device must provide adequate rigidity to allow the fragile die to be handled without being damaged in subsequent manufacturing or assembly steps, such as attachment of a heat sink.

One conventional strategy intended to meet the above challenge is to encapsulate the die in an epoxy or other encapsulant material, which fills the space between a heat spreader cap and an underlying substrate board to which the die is electrically connected. An advantage of this conventional strategy is that a thick layer of encapsulant surrounds and protects the die and also supports and attaches the heat spreader cap. Because the encapsulant layer supporting the heat spreader cap is thick, it is relatively compliant in shear and so does not present an edge constraint on the thermal expansion of the cap relative to the substrate board. Thermally induced stresses due to the mismatch of coefficient of thermal expansion (CTE) between the cap and the die produce stress near the center of the cap, but stresses that would be caused due to CTE mismatch between the cap and the substrate board are relieved by shearing of the thick encapsulant layer. One reason why this is important is because, typically, the temperature difference between the die and the substrate board is larger than the temperature difference between the die and the cap.

However, the conventional strategy of chip encapsulation suffers from practical problems and assembly difficulties associated with the control of a relatively large volume of pre-solidified encapsulant in a mass-manufacturing environment. A conventional strategy to reduce these manufacturing difficulties is to eliminate the thick encapsulant layer and instead support and attach the heat spreader by forming a lip around its periphery that is bonded directly to the substrate board by a bonding layer that is significantly thinner than previously used encapsulant layers. Today, such a bonding layer might have a thickness less than 0.25 mm. Such a conventional heat spreader typically has a cavity in its center region that attaches to the die and that is raised up from the packaging substrate. The die is thermally coupled with the heat spreader lid by either direct contact or via a thermal interface material situated between the die and the inner surface of the cavity in the lid. The raised peripheral lip, formed around the cavity, extends down toward the substrate board and is bonded to the substrate board. A metal plate called a heat sink, which may include metal fins to increase heat transfer to the surrounding air, is typically bonded, perhaps by a thermally conductive adhesive, to the typically flat, upper surface of the heat spreader lid.

Typically the die, substrate, heat spreader lid, and heat sink do not all have the same coefficients of thermal expansion. Differences in the coefficients of thermal expansion can lead to the creation of significant stresses during operation. Such stresses can be expected to cyclically vary because all the components are typically subjected to temperature cycling during operation of the device. For example, semiconductor packages that have been soldered to a motherboard and placed in a computer are typically subjected to temperature cycling during computer operation. An example of such temperature cycling may be a temperature variation between the environmental temperature (e.g. room temperature) and the maximum electrical component operating temperature (e.g. 100° C.). Resulting periodic variations in thermal stress may ultimately result in functional and/or structural failure, including cracking of the die, adhesive failure between the lid and the substrate board, and/or separation between the lid and the thermal interface material thermally coupling it to the die. For example, cyclically varying thermal stresses can cause periodic warping of the heat spreader lid or underlying substrate board, which, in turn, can cause the thermal interface material to migrate from the gap between the die and the heat spreader lid. Such migration (or pumping) of the thermal interface material can cause an undesired increase in the thermal isolation between the die and the heat spreader lid, and therefore can cause functional failure.

The heat spreader lid material typically has a greater coefficient of thermal expansion than the underling substrate board. Therefore, as temperature increases, the lid expands and its deformation is constrained by the bonding of the edge or "lip" of the lid to the substrate. As the lid expands, it may warp in such a way that the center portion of the lid's cavity rises away from the die, or it may cause the substrate board to warp. Such warping degrades the interface between the lid and the die, impeding heat flow, and puts stress on the adhesive bond. If temperature cycling is severe enough, then the bond between the lid and the substrate board can fail and/or the lid can delaminate from the thermal interface material resulting in degraded thermal performance of the system.

Significant warping due to thermal expansion against an edge constraint is a problem that does not present itself in the case of encapsulated microchip package configuration having heat spreader cap that lacks a lip that is bonded to the substrate. This is because in such encapsulated microchip package configurations the encapsulant layer between the between the cap and the substrate is so thick that it is relatively compliant in shear so that the substrate does not present an edge constraint to the thermal expansion of the cap.

Although changing the design to use a more compliant bond between the lip of a heat spreader lid and the substrate in non-encapsulated microchip packages might also serve to mitigate thermal stresses, doing so can bring other practical problems. Specifically, the use of soft adhesives in a precision manufacturing environment can unacceptably reduce control over the ultimate position of the components and/or the robustness of their attachment, and can cause unacceptable contamination, outgassing, etc. What is needed is a heat spreader lid having a lip that can be bonded to the substrate board by conventional methods that are used in typical non-encapsulated chip packages, yet that can also be thermally cycled with improved reliability.

BRIEF SUMMARY OF THE INVENTION

A heat spreader lid, coupled to an underlying electronic component that is electrically connected to a substrate board, the heat spreader lid comprising a center region, an outer periphery region which includes a lip adapted to be bonded to the substrate board, and a strain isolation region located between the center region and the outer periphery region.

BRIEF DESCRIPTION OF THE DRAWINGS

In these figures, similar numerals refer to similar elements in the drawing. It should be understood that the sizes of the different components in the figures may not be to scale, or in exact proportion, and are shown for visual clarity and for the purpose of explanation.

DETAILED DESCRIPTION

Figure 1:
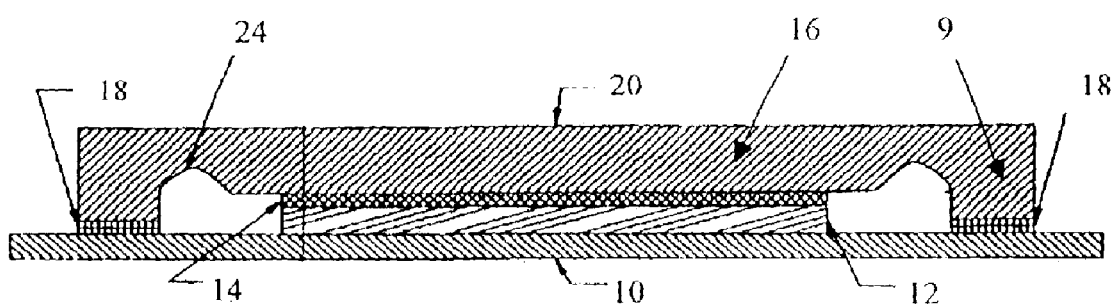
FIG. 1 is a cross section of a semiconductor package including an integrated heat spreader lid according to an embodiment of the present invention having regions of reduced lid thickness.

Disclosed is a heat spreader for electronic circuit components. Referring to FIG. 1, a semiconductor package is comprised of a substrate 10, a die 12, and an optional thermal interface material 14. A heat spreader lid 16 is bonded to substrate board 10 via bonding layer 18, and the lid 16 is thermally coupled to the die 12 via thermal interface material 14. Thermal interface material 14 is optional; the required thermal coupling can be accomplished either by direct physical contact of the lid with the underlying electronic component or via physical contact of the lid with a thermal interface material that transfers heat from the underlying electronic component. Many thermally conductive materials are suitable for use as thermal interface material. Typical thermal interface materials include silicone or polymer based adhesives doped with aluminum, silver, boron nitride, or aluminum nitride. Typical thermal interface materials also include lead, gold, or tin solder utilized in a reflow metal interface. Typically, the thickness of the thermal interface material layer ranges from zero, in the case of thermal coupling via direct contact, to 0.2 mm. The bonding layer 18 is typically an adhesive layer that is typically less than 0.75 mm thick. A lip 9 is formed near the outer periphery of the heat spreader lid 16 to enable the lid to be bonded to the underlying substrate board 10.

The heat spreader lid 16 is typically composed of a high thermal conductivity material, such as copper, aluminum, or a metal matrix composite having thermal conductivity in excess of 100 Watts/meter ° K. (W/m ° K.). A copper heat spreader lid may be plated with another metal such as nickel for corrosion protection. The size of the heat spreader lid is dictated by the size of the underlying die and adjacent components, and the amount of heat generated (which influences the size of overlying heat sink). A typical size to accommodate a modern central processing unit (CPU) integrated circuit die is 18 mm×18 mm square to 45 mm×45 mm square, however, other sizes and shapes might be required to accommodate different packaging strategies, different electrical components, or future electrical components of the same type. A metal component called a heat sink (not shown in FIG. 1), which may include metal fins to promote rapid convection of excessive heat, is typically attached by a clip or bonded, perhaps with a thermally conductive adhesive, to the top surface 20 of the heat spreader lid 16.

Processes for manufacturing the heat spreader lid 16 can use several steps including blanking, coining, piercing, deburring, cleaning, plating, and inspection. The steps, in sum, transform raw material taken from a copper coil into a finished part. One or more of these steps, such as the cleaning and inspection steps, can be repeated during the course of the manufacturing process. Although copper coils or strips are referenced as raw material in this process description, it should be understood that another suitable heat-conductive material can be substituted for copper.

The first main step in the manufacturing process is usually to sever square or rectangular blanks from a copper strip. This first main step can be accomplished using a progressive blanking die in a high speed press.

The second main step of the manufacturing process is usually to coin the blanks to form lids having a lip near the periphery and a cavity in the center region. The blanks may be coated with oil prior to the coining step.

The third step of the manufacturing process is to form strain isolation regions, configured according to the present invention, to the extent that such regions were not formed during the earlier blanking and coining steps. In the case of strain isolation regions comprising through-slots, it is preferred that such through-slots be punched using a piercing press.

The fourth step of the manufacturing process is to deburr, clean, and dry the lids. A grinding step may precede the deburring step if necessary to bring the lid into compliance with flatness specifications. Following these steps, the lids may be etched and then plated with a material such as nickel. Additional cleaning and inspection steps may precede or follow any of the steps described above. During assembly of the lid in a semiconductor package, adhesive may be placed on some or all of the lip of the lid, to facilitate bonding to the substrate board.

The purpose of the finished heat spreader is to protect the die and to disperse the heat generated by the die during its operation. The highly thermally conductive materials typically used for the lid typically have a greater coefficient of thermal expansion than the underling substrate board. As a non-encapsulated semiconductor package heats up, the lid expands but its expansion is constrained at the periphery by the bonding layers 18 which may go around the entire edge of the lid 16. This peripheral constraint causes stress in the expanding lid 16 which, in the case of a conventional lid, may cause it to warp in such a way that its center portion lifts away from the die, or may cause deflection in the underlying substrate board 10. Separation of the lid from the die 12 will degrade the thermal coupling between them, and therefore reduce the heat transfer away from the die—possibly impairing system performance. Thermally induced warping also puts stress on the bond layers. If a non-encapsulated semiconductor package gets hot enough and there is enough difference between the coefficients of thermal expansion of the lid and substrate, catastrophic structural failure of the bonding layer may result. Furthermore, cyclic thermal loading can cause cyclic warping which can pump the thermal interface material out of the interface between a conventional lid and die.

Such thermally induced warping and its potential adverse effects on system performance can be reduced according to the present invention. According to an embodiment of the present invention, a plurality of strain isolation regions, such as regions of reduced thickness 24 shown in FIG. 1, can reduce thermally induced stress and isolate thermally induced strain in a heat spreader lid 16. During manufacturing of heat spreader lids according to an embodiment of the present invention, through slots and/or regions of reduced thickness are created partially or completely through the lid. These regions are located in preferred locations arranged around the periphery of the lid so as to enhance stress relief and isolate strain, while substantially maintaining the heat spreading capability of the lid. Near peripheral locations for the strain isolation regions can help avoid interference with heat transfer from the central area of the center region of the lid, where the die often produces the most heat.

Figure 2:
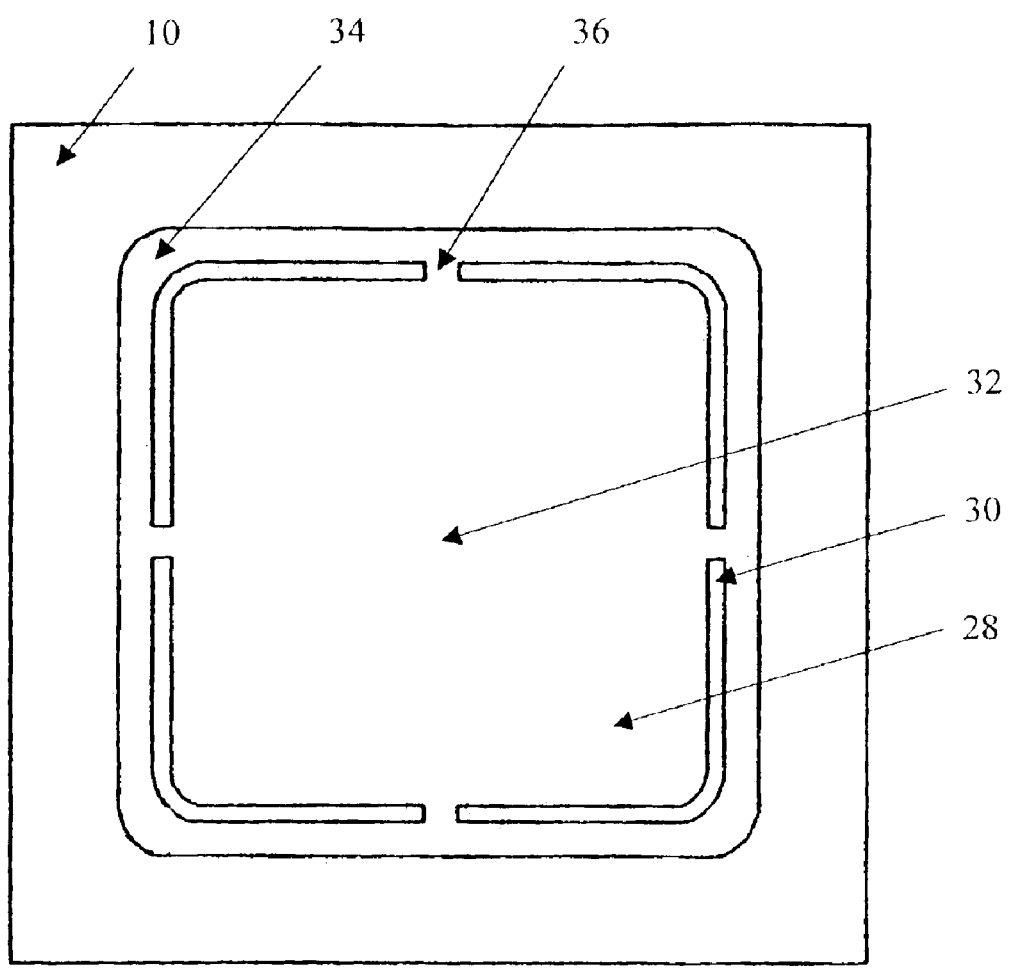
FIG. 2 is a top view of an integrated heat spreader lid according to an embodiment of the present invention having through-slots, shown covering a semiconductor package.

Another embodiment of the present invention is shown in FIG. 2. Heat spreader lid 28 is shown in top view as bonded to substrate 10. A plurality of through-slots 30 are positioned between the center region 32 and outer periphery region 34 which comprises a lip. In this embodiment, the center region 32 remains connected to the outer periphery region 34 via four connections or regions of connection 36. The thickness of the lid in the center region 32 is typically chosen in the range 0.5 mm to 8 mm for present-day applications. Through-slots 30 may be partially or fully sealed with a suitable filler material, such as a polymer material. The width of through-slots 30 is typically chosen to be narrower than one-half the thickness of the lid for a four-slot embodiment of the present invention. The width of connections 36 for a four-slot embodiment of the present invention is typically chosen in the range of 0.5 mm to 15 mm.

Figure 3:
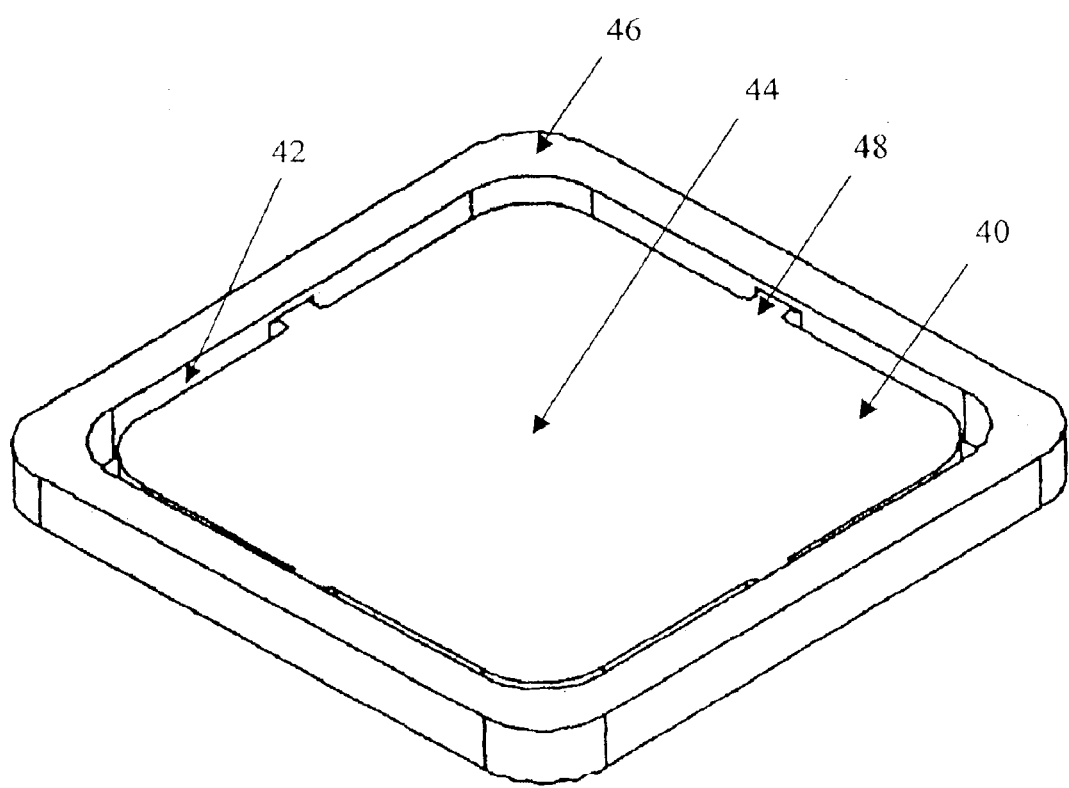
FIG. 3 is a bottom perspective view of another embodiment of the present invention having through slots.

Another embodiment of the present invention utilizing through-slots is shown in perspective view in FIG. 3. A cavity is formed by the recession of center region 44 relative to the outer periphery region 46 which comprises a lip. This cavity is typically deep enough to enclose the die 12 and the thermal interface material 14. For example, one contemporary CPU die requires a cavity depth of approximately 0.6 mm. Bonding layer 18 affixes to the outer periphery region 46. A plurality of through-slots 42 is positioned between center region 44 and outer periphery region 46. In this embodiment, the center region 44 remains connected to the outer periphery region 46 via four connections or regions of connection 48.

Figure 4:
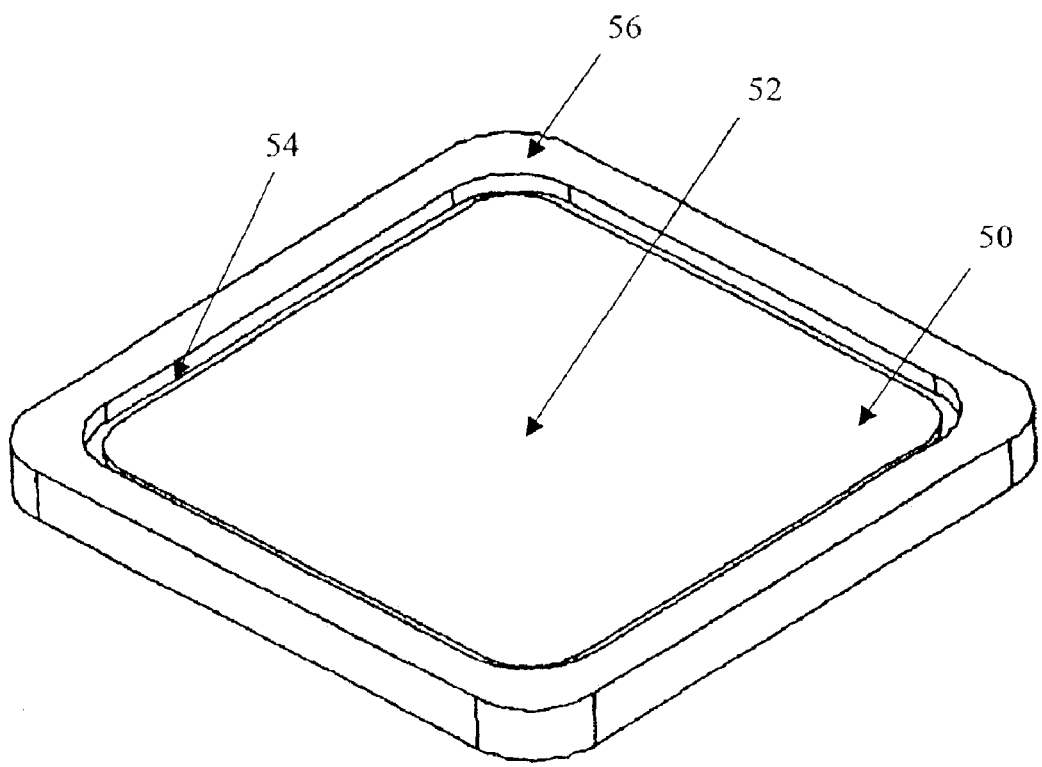
FIG. 4 is a bottom perspective view of an embodiment of the present invention having regions of reduced lid thickness.

Another embodiment of the present invention is shown in perspective view in FIG. 4. A cavity is formed by the recession of center region 52 relative to outer periphery region 56 which comprises a lip. This cavity is typically deep enough to enclose the die 12 and the thermal interface material 14. Bonding layer (not shown) affixes to the outer periphery region 56. A single region of reduced lid thickness 54 is positioned between center region 52 and outer periphery region 56. In this embodiment, the region of reduced lid thickness 54 comprises a single contiguous groove running all the way around center region 52. The depth of such a groove is typically chosen to be in the range of 20% to 80% of the average thickness of the lid in the center region 52. Often the groove depth will be less than 2 mm. In another embodiment (not shown), a plurality of non-contiguous grooves is used. The width of such a grove is typically chosen in the range of one-half times its depth to eight times its depth, in the case where the groove is fabricated to have a flat bottom. If a region (or regions) of reduced lid thickness is cut or etched such that its bottom is V-shaped or otherwise tapered in cross-section, such as regions of reduced thickness 24 shown in cross-section in FIG. 1, then the width of such a region is typically chosen to be in the range of one times its depth to 15 times its depth.

As temperature increases and the heat spreader lid expands, the strain isolation regions provide stress relief, resulting in a lower mechanical load on the bond between the lid and the substrate. This decreases the chance of catastrophic mechanical failure and increases the life expectancy of the device. As temperature increases and the heat spreader lid expands, the strain isolation regions provide stress relief, resulting in less thermal warping of the lid or the underlying substrate board. In an environment characterized by cyclic temperature variation, reduced thermal warping leads to reduced migration of optional thermal interface material that may help thermally couple the lid to the die. That, in turn, results in more robust long-term functionality and improved reliability.

Figure 5:
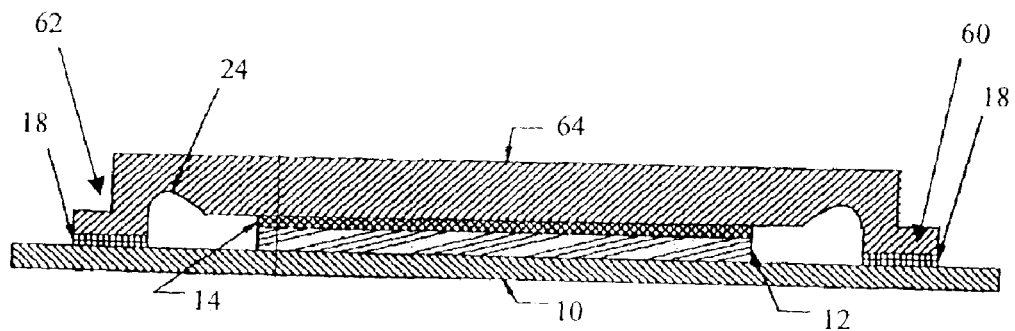
FIG. 5 is a cross section of a semiconductor package including an integrated heat spreader lid according to an alternative embodiment of the present invention having regions of reduced lid thickness.

An alternative embodiment of the present invention having regions of reduced lid thickness is shown in a semiconductor package in FIG. 5 is cross sectional view. Here, the lip 60 in the outer periphery region 62 is not thicker than the thickness of the lid in the center region 64. However, the lip 60 still protrudes in the outer periphery region 62 enough to facilitate bonding to the substrate board 10 by methods that are conventional in the case of non-encapsulated microchip package configurations.

It should be understood that the invention is not limited to the specific parameters, materials and embodiments described herein. Various modifications may be made within the scope of the present invention.

What is claimed is:

1. A heat spreader lid, coupled to an underlying electronic component that is electrically connected to a substrate board, said heat spreader lid comprising:
    a center region;
    an outer periphery region which includes a lip adapted to be bonded to the substrate board; and
    a strain isolation region located between the center region and the outer periphery region.

2. The heat spreader lid of claim 1 wherein the strain isolation region includes one or more through-slots.

3. The heat spreader lid of claim 1 wherein the strain isolation region includes one or more regions of reduced lid thickness.

4. The heat spreader lid of claim 2 wherein the through-slots are partially or completely sealed with a filler material.

5. The heat spreader lid of claim 2 having more than one through-slot, the through-slots being separated from each other by connecting regions.

6. The heat spreader lid of claim 3 wherein a single region of reduced lid thickness surrounds the center region.

7. The heat spreader lid of claim 3 wherein the regions of reduced lid thickness comprise one or more grooves.

8. The heat spreader lid of claim 5 wherein the thickness of the heat spreader lid at the location of at least one of the connecting regions is reduced relative to the thickness of the heat spreader lid in the center region.

9. The heat spreader lid of claim 5 wherein the width of at least one connecting region is less than 15 mm.

10. The heat spreader lid of claim 5 wherein the width of at least one through slot is more than one half the thickness of the heat spreader lid in the center region.

11. The heat spreader lid of claim 5 wherein at least one of the through-slots is a hole.

12. The heat spreader lid of claim 5 wherein at least one of the through-slots is a curved through-slot.

13. The heat spreader lid of claim 5 having four through-slots, a first through-slot and a third through-slot being centered on a transverse centerline of the heat spreader lid.

14. The heat spreader lid of claim 7 wherein at least one groove is less than 2 mm deep.

15. The heat spreader lid of claim 7 wherein at least one groove has a depth at least 20% of the average thickness of the lid in the center region but at most 80% of the average thickness of the lid in the center region.

16. The heat spreader lid of claim 7 wherein at least one groove has a width that is greater than its depth but less than fifteen times its depth.

17. The heat spreader lid of claim 13 wherein at least one of the through-slots is a round hole.

18. A semiconductor package comprising:
    a semiconductor die;
    a substrate board;
    a heat spreader lid, said heat spreader lid comprising;
    an outer periphery region which includes a lip attached to the substrate board;
    a center region; and
    a strain isolation region located between the center region and the outer periphery region.

19. The semiconductor package of claim 18 wherein the strain isolation region includes at least one through-slot.

20. The semiconductor package of claim 18 wherein the strain isolation region includes at least one region of reduced lid thickness.

21. The semiconductor package of claim 19 having more than one through-slot, the through-slots being separated from each other by connecting regions.

22. The semiconductor package of claim 19 wherein the width of at least one through slot is more than one half the thickness of the heat spreader lid in the center region.

23. The semiconductor package of claim 20 wherein the regions of reduced lid thickness comprise one or more grooves.

24. The semiconductor package of claim 21 wherein the thickness of the heat spreader lid at the location of at least one of the connecting regions is reduced relative to the thickness of the heat spreader lid in the center region.

25. The semiconductor package of claim 21 wherein the width of at least one connecting region is less than 15 mm.

26. The semiconductor package of claim 21 having four through-slots, a first through-slot and a third through-slot being centered on a transverse centerline of the heat spreader lid.

27. The semiconductor package of claim 23 wherein at least one groove is less than 2 mm deep.

28. The semiconductor package of claim 23 wherein at least one groove has a depth at least 20% of the average thickness of the lid in the center region but at most 80% of the average thickness of the lid in the center region.

29. The semiconductor package of claim 23 wherein at least one groove has a width that is greater than its depth but less than fifteen times its depth.

30. A heat spreader lid, coupled to an underlying electronic component that is electrically connected to a substrate board, said heat spreader lid comprising:
    a center region;
    an outer periphery region; and
    at least one groove located between the center region and the outer periphery region having a depth at least 20% of the average thickness of the lid in the center region but at most 80% of the average thickness of the lid in the center region.

31. The heat spreader lid of claim 30 comprising a groove having a width that is greater than its depth but less than fifteen times its depth.

32. The heat spreader lid of claim 30 comprising a groove that is less than 2 mm deep.

33. A semiconductor package comprising:
    a semiconductor die that is electrically connected to a substrate board;
    a heat spreader lid coupled to the semiconductor die, said heat spreader lid comprising;
    an outer periphery region;
    a center region; and
    at least one groove located between the center region and the outer periphery region having a depth at least 20% of the average thickness of the lid in the center region but at most 80% of the average thickness of the lid in the center region.

34. The semiconductor package of claim 33 wherein the heat spreader lid comprises a groove having a width that is greater than its depth but less than fifteen times its depth.

35. The semiconductor package of claim 33 wherein the heat spreader lid comprises a groove that is less than 2 mm deep.

* * * * *